United States Patent [15] 3,646,465

Hartlaub [45] Feb. 29, 1972

[54] DUAL WIDEBAND AMPLIFIER

[72] Inventor: Jerome T. Hartlaub, New Brighton, Minn.

[73] Assignee: The United States of America as represented by the Secretary of the Army

[22] Filed: July 15, 1970

[21] Appl. No.: 54,944

[52] U.S. Cl. ....................330/30 R, 330/16

[51] Int. Cl. ....................H03f 33/68

[58] Field of Search ....................330/30 R

[56] References Cited

UNITED STATES PATENTS

| | | | |
|---|---|---|---|
| 3,440,440 | 4/1969 | Prohofsky et al. | 307/208 |
| 3,341,785 | 9/1967 | Merryman et al. | 330/28 |
| 2,959,741 | 11/1960 | Murray | 330/30 R X |

*Primary Examiner*—Nathan Kaufman

*Attorney*—Harry M. Saragovitz, Edward J. Kelly and Herbert Berl

[57] ABSTRACT

A dual amplifier having the capability to amplify extremely low level photodiode transducer output signals to useful voltage levels. The input signals are amplified while input signal phase separation is preserved at the output. Each channel has a first stage for voltage gain, a second stage for high to low impedance transfer with corresponding current gain and an integrated circuit amplifier having a nearly flat voltage gain over the bandwidth. The dual amplifiers are essentially physically overlapping so that the design includes both adequate power supply decoupling and simplicity for easy lead positioning in order to achieve negligible interchannel coupling.

1 Claims, 1 Drawing Figure

PATENTED FEB 29 1972
3,646,465
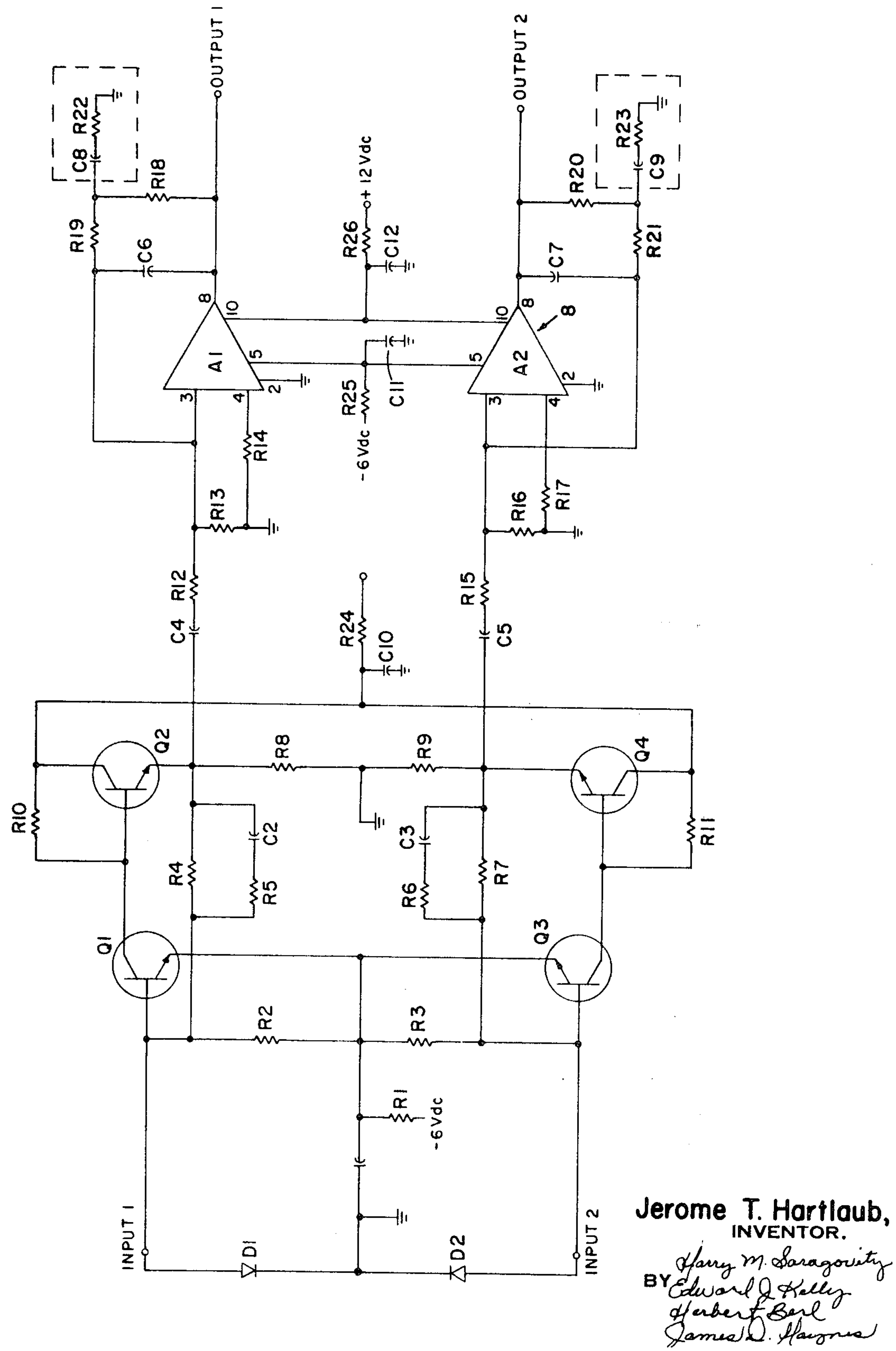
Jerome T. Hartlaub,
INVENTOR.
BY Harry M. Saragovitz
Edward J. Kelly
Herbert Berl
James D. Haynes

DUAL WIDEBAND AMPLIFIER

BACKGROUND OF THE INVENTION

This invention relates to wideband amplifiers and particularly wideband amplifiers for use with laser gyroscopes. The output laser of the gyroscope is detected by photodiode transducers. It is necessary to amplify the extremely low level photodiode transducer output signals (e.g., 10 na.) to useful voltage levels (e.g., 1 volt). In certain environments, missilry for example, it is imperative that the amplifier by microminiaturized and that an amplifier having two channels and possessing the ability to amplify input signals while maintaining signal phase separation in the output be available. Accordingly, it is an object of this invention to provide an amplifier which is subject to microminiaturization and maintains phase separation in the output signals with respect to the input signals.

It is another object of this invention to provide an amplifier wherein the voltage biasing on the input facilitates common ground connection of photodiodes which are used to generate input signals to the amplifier channels.

It is also an object of this invention to provide an amplifier which requires voltages which are suitable for linear integrated circuits.

Yet another object of this invention is to provide an amplifier which has the ability to increase its high frequency capability by one octave.

SUMMARY OF THE INVENTION

The dual wide bandwidth amplifier is composed of two amplifiers which are physically overlapping so that the device includes both adequate power supply decoupling, simplicity and negligible interchannel coupling. An input transistor in each channel provides voltage gain while a second transistor provides high to low impedance transfer with corresponding gain. An integrated circuit amplifier provides nearly flat voltage gain over the bandwidth. Negative feedback is applied around both the second transistor and the integrated circuit stages for gain and frequency stability. The input transistors are biased to facilitate a common ground connection for both photodiodes used to generate input signals for the dual amplifier. The input signals are amplifier while input signal phase separation is preserved at the output.

BRIEF DESCRIPTION OF THE DRAWING

The single FIGURE drawing is a schematic diagram of the present invention.

DESCRIPTION OF THE PREFERRED EMBODIMENT

Referring to the drawing, the dual amplifier is composed of two identical liner amplifiers designed with state-of-the-art components for high performance, minimum number of parts and adaptability to microminiaturization. The active components in channel 1 are transistors Q1 and Q2 and integrated amplifier A1. The corresponding components in channel 2 and Q3, Q4, and A2.

The two channels, being microminiaturized, are essentially physically overlapping so that the device includes both adequate power supply decoupling and simplicity. There is no need for complicated feedback loops. The physical arrangement of the circuit components is such that leads are easily positioned to achieve negligible interchannel coupling.

The outputs of two matched, physical adjacent, light sensitive photodiode transducers D1 and D2 are connected to the amplifier inputs. The input signals generated by the photodiodes are amplified while the input signal phase separation is preserved at the output. The quiescent input voltage is about −5.5 volts. This level was selected to facilitate reverse biasing the photodiodes while maintaining the common cathodes connected to ground. Bias voltage is applied to D1 and D2 thru resistor R1 and resistors R2 and R3 respectively. Resistors R4, R5, and R8 together with capacitor C2 provide bias to Q2 while resistors R6, R7, and R9 together with capacitor C3 provide bias to Q3. Resistors R10 and R11 provide a negative feedback loop for Q2 and Q4 respectively. Q1 and Q3 provide voltage gain while Q2 and Q4 provide high to low impedance transfer with corresponding current gain. Q2 and Q4 are respectively connected to amplifiers A1 and A2 via resistors R12, R13, R14 and capacitor C4, and resistors R15, R16, R17 and capacitor C5. Resistors R18 and R19 and capacitor C6 provide a negative feedback for A1 while resistors R20 and R21 and capacitor C7 provide negative feedback for A2 for gain and frequency stability. Amplifiers A1 and A2 provide nearly flat voltage gain over the bandwidth. The bandwidth of each channel may be increased by about 1 octave by the addition of resistor R22 and capacitor C8 to channel 1 and resistor R23 and capacitor C9 to channel 2. Capacitors C1, C10, C11, and C12 filter to ground any AC signals that may be present. Resistors R1, R24, R25, and R26 limit the current from the voltage supplies.

Each amplifier has flat (±0.1 db.) frequency response between 3 db. points at 70 Hz. and 750 kHz. The low end rolloff is 6 db./octave while the high end rolloff is 12 db./octave. The voltage output per current input is 14 volts out per microamp input. If all electrical noise output is assumed from input noise current, the input noise current is 3.5 na. RMS. The above characteristics are essentially insensitive to temperature from 40° to 200° F.

I claim:

1. A dual wideband amplifier having a first and second channel for receiving similar low level signals from an optical source and individually amplifying the signals while maintaining phase separation thereof to preserve individual output signal differences, each of said channels comprising:

a single transistor voltage gain section;

a photodiode detector having the anode thereof connected as an input to the base of said gain transistor for activating said transistor directly in response to optical energy impinging on said diode;

a common ground connected to the cathode of said diode;

a high to low impedance transfer section comprising a second transistor, the base of said second transistor being connected to the collector of said gain transistor;

an integrated circuit amplifier having an input coupled to the emitter of said second transistor, said amplifier having an output for coupling out amplifier signals; and a power source common to said transistors and amplifiers of each of said channels for supplying negative and positive biasing voltage thereto; and said first channel photodiode being physically adjacent said second channel photodiode for responding to the same variable energy level and maintaining signal phase separation of received energy while coupling the signals to respective amplifiers.

* * * * *